United States Patent
Jang et al.

(10) Patent No.: US 8,385,405 B2
(45) Date of Patent: Feb. 26, 2013

(54) RECORDED MEDIUM HAVING PROGRAM FOR CODING AND DECODING USING BIT-PRECISION, AND APPARATUS THEREOF

(75) Inventors: Euee-S Jang, Seoul (KR); Sun-Young Lee, Seoul (KR); Chung-Ku Lee, Incheon (KR)

(73) Assignee: Humax Co., Ltd., Seongnam-Si (KR)

( * ) Notice: Subject to any disclaimer, the term of this patent is extended or adjusted under 35 U.S.C. 154(b) by 846 days.

(21) Appl. No.: 12/515,076

(22) PCT Filed: Oct. 19, 2007

(86) PCT No.: PCT/KR2007/005132
§ 371 (c)(1),
(2), (4) Date: May 15, 2009

(87) PCT Pub. No.: WO2008/060040
PCT Pub. Date: May 22, 2008

(65) Prior Publication Data
US 2010/0316113 A1    Dec. 16, 2010

(30) Foreign Application Priority Data
Nov. 17, 2006  (KR) .................. 10-2006-0114088

(51) Int. Cl.
*H04B 1/66*  (2006.01)
*H04N 11/02*  (2006.01)
(52) U.S. Cl. .............. 375/240; 375/240.03; 375/259
(58) Field of Classification Search ............ 375/240, 375/259, 295, 340, 240.01–240.03
See application file for complete search history.

(56) References Cited

U.S. PATENT DOCUMENTS

| 5,528,628 A | 6/1996 | Park et al. |
| 5,559,557 A * | 9/1996 | Kato .............. 375/240.03 |
| 6,397,367 B1 | 5/2002 | Park et al. |
| 2004/0039983 A1 | 2/2004 | Brossier et al. |

FOREIGN PATENT DOCUMENTS

| CN | 1527610 A | 9/2004 |
| JP | 2002-84198 A | 3/2002 |
| KR | 10-0636370 B1 | 10/2006 |
| KR | 636370 B1 * | 10/2006 |

OTHER PUBLICATIONS

Won, J. W. et al., "Bit-Precision Method for Low Complex Lossless Image Coding", In: D.S. Huang, X-P. Zhang, G.-B Huang: "Advances in Intelligent Computing" Sep. 16, 2005, Springer Verlag, Berlin/Heidelberg, Germany ISBN: 978-3-540-28226-6vol. 3644/200, pp. 155-164, XP002586166, retrieved from the internet URL: http://www.springerlink.com/content/02yc7hnp01g8cq7d/fulltext.pdf>.

* cited by examiner

*Primary Examiner* — David B. Lugo
(74) *Attorney, Agent, or Firm* — Birch, Stewart, Kolasch & Birch, LLP

(57) ABSTRACT

A coding/decoding device using a bit-precision is disclosed. A coding device includes a bit-precision selecting unit, selecting a bit-precision value according to data to be coded; and a coding unit, generating a bit-stream by coding the data according to the selected bit-precision value, whereas the selected bit-precision value is inserted into the bit-stream.

With the present invention, video data can be entropy-coded by selectively determining the number of bits and there can be provided the decoding method with a little complexity which has not only the identical compression rate to the conventional entropy coding method but also no necessity of additional computation when video data is decoded.

14 Claims, 11 Drawing Sheets

|       | Field #1 | Field #2 | Field #3 | Field #4 |
|-------|----------|----------|----------|----------|
| VOP #1 | / | / | / | / |
| VOP #2 | / | / | / | / |
| VOP #3 | / | / | / | / |
| VOP #4 | / | / | / | / |

(b)

|       | Field #1 | Field #2 | Field #3 | Field #4 |
|-------|----------|----------|----------|----------|
| VOP #1 | / | / | / | / |
| VOP #2 | X | X | X | X |
| VOP #3 | / | / | / | / |
| VOP #4 | \ | \ | \ | \ |

(c)

|       | Field #1 | Field #2 | Field #3 | Field #4 |
|-------|----------|----------|----------|----------|
| VOP #1 |  |  | / | / |
| VOP #2 |  |  | X | X |
| VOP #3 |  |  | / | / |
| VOP #4 |  |  | \ | \ |

(d)

|       | Field #1 | Field #2 | MB Field #1 | MB Field #2 | BField #1 | BField #2 |
|-------|----------|----------|-------------|-------------|-----------|-----------|
| VOP #1 |  |  |  | / |  | / |
| VOP #2 |  |  |  | X |  | X |
| VOP #3 |  |  |  | / |  | / |
| VOP #4 |  |  |  | \ |  | \ |

(e)

|       | Field #1 | Field #2 | Field #3 | Field #4 |
|-------|----------|----------|----------|----------|
| VOP #1 | / | / | / | / |
| VOP #2 | / | / | / | / |
| VOP #3 | / | / | / | / |
| VOP #4 | / | / | / | / |

|  | Field #1 | Field #2 | Field #3 | Field #4 |
|---|---|---|---|---|
| VOP #1 |  |  |  |  |
| VOP #2 |  |  |  |  |
| VOP #3 |  |  |  |  |
| VOP #4 |  |  |  |  |

(g)

|  | Field #1 | Field #2 | MB Field #1 | MB Field #2 | BField #1 | BField #2 |
|---|---|---|---|---|---|---|
| VOP #1 |  |  |  |  |  |  |
| VOP #2 |  |  |  |  |  |  |
| VOP #3 |  |  |  |  |  |  |
| VOP #4 |  |  |  |  |  |  |

(h)

|  | Field #1 | Field #2 | Field #3 | Field #4 |
|---|---|---|---|---|
| VOP #1 |  |  |  |  |
| VOP #2 |  |  |  |  |
| VOP #3 |  |  |  |  |
| VOP #4 |  |  |  |  |

(i)

|  | Field #1 | Field #2 | Field #3 | Field #4 |
|---|---|---|---|---|
| VOP #1 |  |  |  |  |
| VOP #2 |  |  |  |  |
| VOP #3 |  |  |  |  |
| VOP #4 |  |  |  |  |

(j)

|  | Field #1 | Field #2 | MB Field #1 | MB Field #2 | BField #1 | BField #2 |
|---|---|---|---|---|---|---|
| VOP #1 |  |  |  |  |  |  |
| VOP #2 |  |  |  |  |  |  |
| VOP #3 |  |  |  |  |  |  |
| VOP #4 |  |  |  |  |  |  |

FIG. 7
(a) VS (Video Sequence) Unit (MPEG-4)
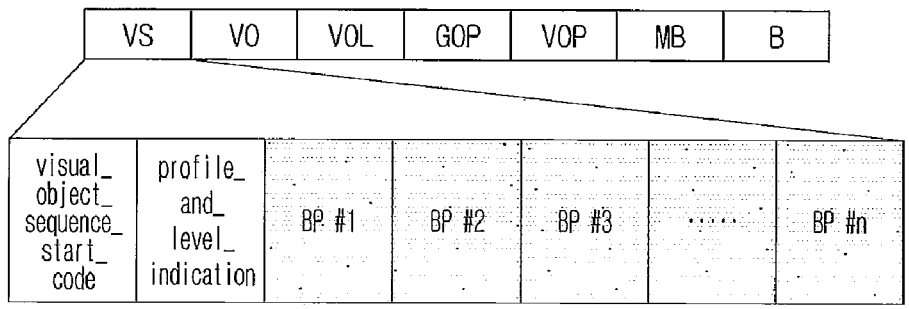
(b) VO (Video Object) Unit (MPEG-4)
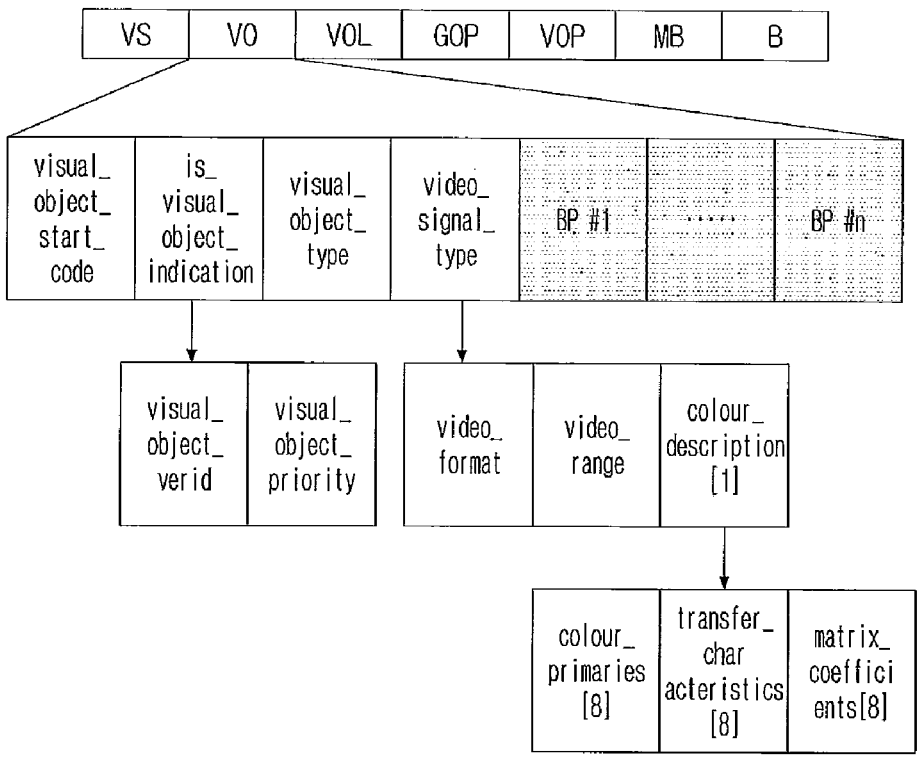
(c) VOL (Video Object Layer) Unit (MPEG-4)
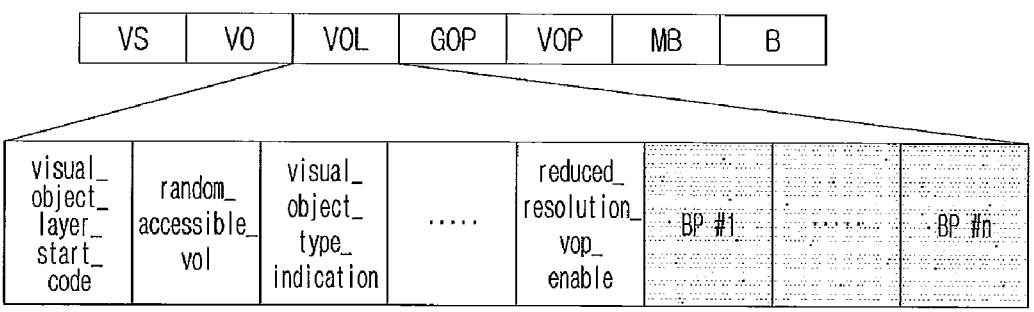

FIG. 8
(d) GOP (Group of Pixture) Unit (MPEG-4)
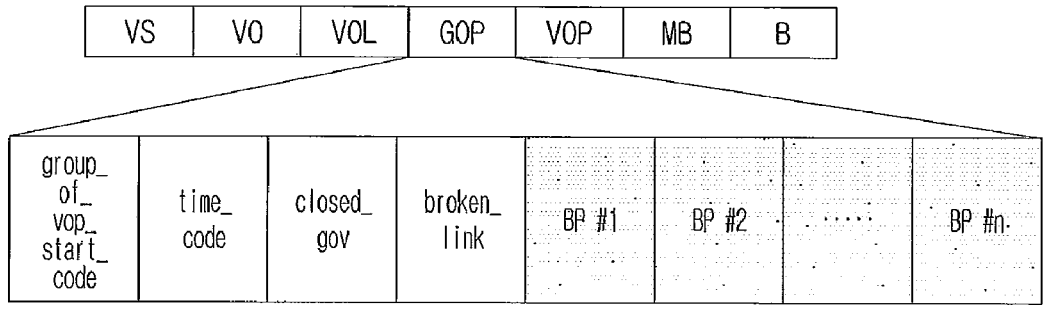
(e) VOP (Video Object Plane) Unit (MPEG-4)
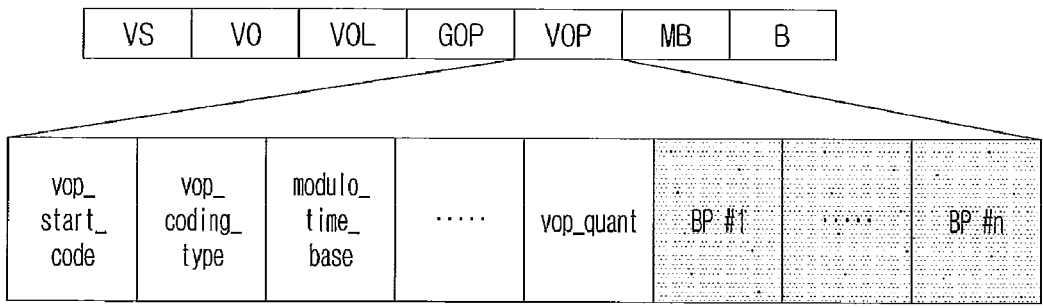
(f) MB (Macro Block) Unit (MPEG-4)
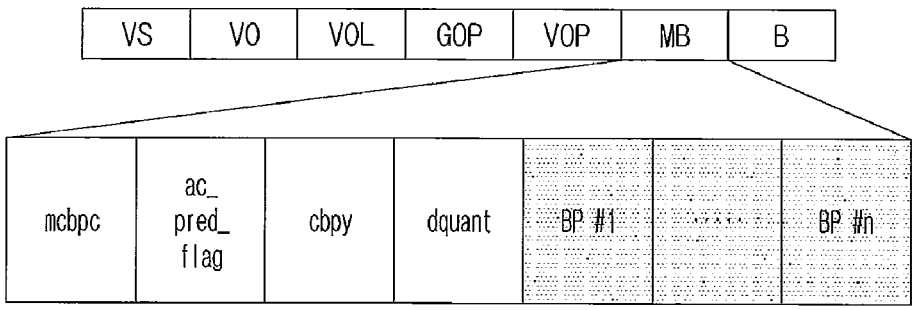
(g) B (Block) Unit (MPEG-4)
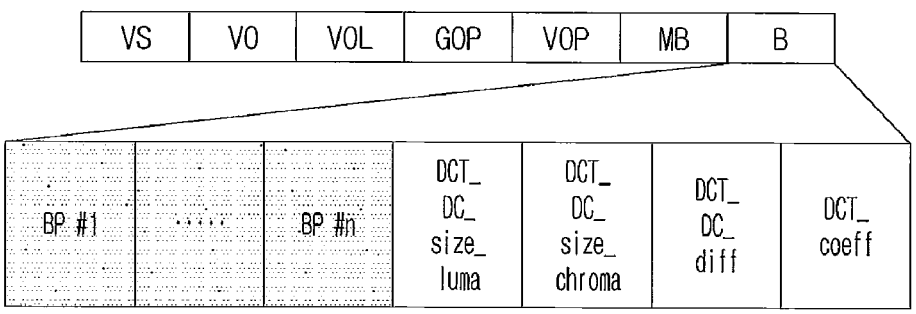

| MPEG-4 (Huffman) | BP-RunLevel | | BP-VLD | |
|---|---|---|---|---|
| | bits | % | bits | % |
| 4,986,104 | 4,436,536 | 88.98 | 4,493,360 | 90.12 |
| 4,383,904 | 3,656,216 | 83.40 | 3,686,560 | 84.09 |
| 4,025,920 | 3,139,739 | 77.99 | 3,152,912 | 78.32 |
| 3,922,896 | 2,967,888 | 75.66 | 2,977,208 | 75.89 |

RECORDED MEDIUM HAVING PROGRAM FOR CODING AND DECODING USING BIT-PRECISION, AND APPARATUS THEREOF

TECHNICAL FIELD

The present invention relates to a device for coding and decoding (hereinafter, referred to as coding/decoding), more specifically to a coding/decoding device using bit-precision to compress video data.

BACKGROUND ART

In a digital system, information is represented in a form of a binary sequence of '0' or '1,' and a plurality of binary sequences creates a meaningful information set. The meaningful information set is created in units of 8 bits, 16 bits or 32 bits according to the register size of a main processor. The unit bit is differently referred to as a word. In the information theory, the information, which consists of the information sets or is created in units of words, is referred to as an information source.

Each word constituting the information source is referred to as a symbol. Each symbol has different probability of occurrence. Once the probability of occurrence of each symbol is determined, entropy can be defined. The entropy indicates the amount of information to be stored or transferred according to Shannon's theory. If there is n symbols and the probability of occurrence of an $i^{th}$ symbol is pi, the entropy can be defined as the following formula 1.

$$H = \sum_{i=1}^{n} P_i \log 2 \frac{1}{P_i}$$ [Formula 1]

The entropy shows not only an average information amount per symbol but also a minimum code-length of an information source when the information source is coded. As such, the method of coding the code-length of the information source close to the entropy by using the statistical properties of symbols is referred to as entropy coding.

The entropy coding method is suggested in various ways in order to have the minimum bit number per symbol. The representative conventional entropy coding methods include a run length coding (RLC) method, a Hoffman coding and an arithmetic coding method.

The RLC method is to represent a repeated pixel block as one representative value and the repeated number of the representative value by using the fact that the sequences statistically have similar or identical values. For example, in integer data set {7, 3, 0, 0, 0, 0, 0, 0, 0} to be compressed, '0' is repeated 7 times. Accordingly, if the repeated information '0' is the representative value and the flag showing the repeated number is represented as n, the integer data set {7, 3, 0, 0, 0, 0, 0, 0, 0} is coded to be {7 3 0 N 7}. As a result, the symbols having the whole 9 byte size can be coded to be data having the 5 byte size.

Next, the Hoffman coding method is to change a constant length sign to a variable length sign. In particular, the Hoffman coding method is reduce an average sign length rather than an original sign length by allowing a short sign to be assigned to the symbol having a high generation frequency and a long sign to be the symbol having a low generation frequency. For example, an English text represented by an ASCII code employs 7 bits per letter. However, if the Hoffman coding method is applied, the English letter is represented by using the sign length of 7 bits or less on the average by allowing the letter having the high generation frequency such as "e" and "s" and to be represented with symbols of 7 bits or less and special signs having the low generation frequency to be represented with symbols of 7 bits or more.

Finally, the arithmetic coding method is to represent a variable length symbol string in which various symbols are bound as one constant length sign. The various symbols are bound such that the probability of occurrence of the symbol string can be nearly regular. In the arithmetic coding method, an input symbol is defined in a real number section between 0 and 1. The longer symbols show their narrower intervals. The bit number indicates the size of the interval. The increased number of symbols results in the smaller number of sections used to represent the symbols and the increased number of information bits for indicating the sections.

As described above, in the digital system, the computation is performed in units of words. The units of words are sets having 8 bits, 16 bits or 32 bits. As such, all numbers and letters have been represented based on units of bits. Since this conventional representing method needs more bits than bits necessary to transmit and store meaningful information, the data compression is requested for effective transmission and storage.

Typically, when a video signal including a series of video "frame" is represented in a digital form, a considerable amount of transmitted data is generated. However, since the usable frequency band width of the typical transmission channel is limited, the compression of transmission data is needed in order to transmit the considerable amount of digital data.

However, in accordance with the conventional method of compressing data or coding/decoding entropy, increasing the compression rate results in raising the complexity of the coding device or the decoding device due to their properties.

Also, the conventional method of compressing data or coding/decoding entropy brings about the time delay according to the high compression rate.

DISCLOSURE

Technical Problem

The present invention, which is contrived to solve the aforementioned problems, provides a method of entropy-coding video data by selectively determining the number of bits to represent a letter and a numeral instead of representing information by using a Hoffman table determined in the conventional Hoffman entropy coding/decoding method.

The present invention also provides a decoding method with a little complexity which has not only the identical compression rate to the conventional entropy coding method but also no necessity of additional computation when video data is decoded.

In addition, the present invention provides a coding method of improving environmentally additional compression efficiency without the change of the conventional codec and with the same image quality.

Other problems that the present invention solves will become more apparent through the following description.

Technical Solution

To solve the above problems, an aspect of the present invention features a coding device using a bit-precision, including a bit-precision selecting unit, selecting a bit-precision value according to data to be coded; and a coding unit, generating a bit-stream by coding the data according to the selected bit-precision value.

The coding unit can insert the selected bit-precision value into the bit-stream.

The bit-precision selecting unit can select the bit-precision value according to one of a field unit and a hierarchy unit of the data or a combination thereof.

The coding unit can code a predetermined unit of the data by using the selected bit-precision value.

The bit-precision selecting unit can select a bit value as the bit-precision value, the bit value allowing a compression efficiency of the data to be optimized.

The bit-precision selecting unit can code a predetermined unit of the data for each of a plurality of predetermined bit values and select a bit value as the bit-precision value by using the coded result, the bit value allowing a compression efficiency to be optimized.

The bit-precision selecting unit can further use a probability of a Hoffman table to code the predetermined unit.

The coding unit can code a predetermined unit of the data for each of a plurality of predetermined bit values, and the bit-precision selecting unit can select a bit value as the bit-precision value by using the coded result of the predetermined unit, the bit value allowing a compression efficiency to be optimized.

The coding unit can further use a probability of a Hoffman table to code the predetermined unit.

The coding unit can use a probability of a Hoffman table to code the data.

If Run, Level and Last are generated from a DCT_coefficients symbol value of the data by a run length coding operation, the coding unit can code the Run and the Level to correspond to the selected bit-precision value.

The coding unit can further use a probability of a Hoffman table to code the Run and the Level.

Another aspect of the present invention features a decoding device using a bit-precision, including a bit-precision extracting unit, extracting a bit-precision value from a bit-stream to be decoded; and a decoding unit, decoding the bit-stream according to the extracted bit-precision value.

The bit-precision extracting unit can extract the bit-precision value according to a field unit or a hierarchy unit of the bit-stream or a combination thereof.

The decoding unit can decode a predetermined range of the bit-stream corresponding to each of the extracted bit-precision values.

The decoding unit can further use a probability of a Hoffman table to decode the bit-stream.

Another aspect of the present invention features a recorded medium tangibly embodying a program of instructions executable by a coding device to perform a coding method using a bit-precision, the recorded medium being readable by the coding device, the program including (a) selecting a bit-precision value according to data to be coded; and (b) generating a bit-stream by coding the data according to the selected bit-precision value.

The selected bit-precision value can be inserted into the bit-stream.

The bit-precision value can be selected according to one of a field unit and a hierarchy unit of the data or a combination thereof.

The step of (b) can code a predetermined range of the data.

The step of (a) can select a bit value as the bit-precision value, the bit value allowing a compression efficiency of the data to be optimized.

The step of (a) can include (a1) coding a predetermined unit of the data for each of a plurality of predetermined bit values; and (a2) selecting a bit value as the bit-precision value by using the coded result, the bit value allowing a compression efficiency to be optimized.

The step of (a1) can further use a probability of a Hoffman table to code the predetermined unit.

The step of (b) can further use a probability of a Hoffman table to code the data.

If Run, Level and Last are generated from a DCT_coefficients symbol value of the data by a run length coding operation, the step of (b) can code the Run and the Level to correspond to the selected bit-precision value The step of (b) can further use a probability of a Hoffman table to code the Run and the Level.

Another aspect of the present invention features a recorded medium tangibly embodying a program of instructions executable by a decoding device to perform a coding method using a bit-precision, the recorded medium being readable by the decoding device, the program including (a) extracting a bit-precision value from a decoded bit-stream; and (b) decoding the bit-stream according to the extracted bit-precision value.

The bit-precision value can be extracted according to a field unit, a hierarchy unit or a combination of the bit-stream.

The step of (b) can decode a predetermined range of the bit-stream corresponding to each of the extracted bit-precision.

The step of (b) can further use a probability of a Hoffman table to decode the bit-stream.

DESCRIPTION OF DRAWINGS

FIG. 5 and FIG. 6 show various examples of units selecting a bit-precision value and coding data by using a bit-precision value;

FIG. 7 and FIG. 8 show various examples of a bit-stream coded by using a bit-precision in motion picture expert group 4 (MPEG 4) simple profile (SP) intracoding in accordance with an embodiment of the present invention;

MODE FOR INVENTION

Figure 1:
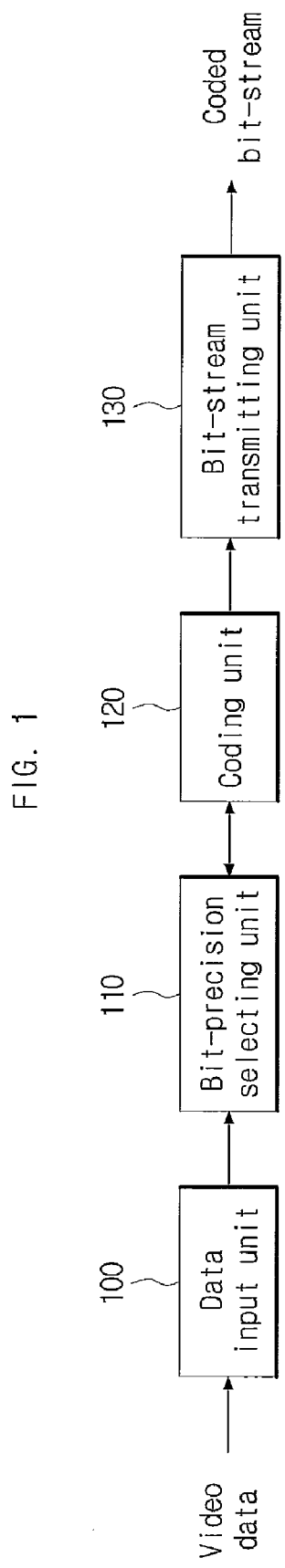
FIG. 1 is a block diagram illustrating a coding unit in accordance with an embodiment of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, some embodiments will be described in detail with reference to the accompanying drawings. Identical or corresponding elements will be given the same reference numerals, regardless of the figure number, and any redundant description of the identical or corresponding elements will not be repeated.

The conception of the coding method using a bit-precision in accordance with the present invention will be firstly described as follows.

The coding method using a bit-precision in accordance with the present invention is to determine a constant bit value of input data symbol values as an example by using a cost function and to binarize the symbol values by using bits as many as the symbol values. For example, it is assumed that inputted symbol values are {2, 1, 0, 4, 5 3} and the bit-precision value is 2, 0 through 3 can be represented by using two bits. However, since the symbol value that is larger than 3 is impossible to be represented by using 2 bits, the symbol value that is larger than 3 is represented by additionally assigning two bits more. Below is more detailed description. The symbol values '2', '1', and '0' are binarized as '10,' '01' and '00.' However, since the symbol value '4' is larger than '3' that is the maximum value capable of being represented by using 2 bits, the symbol value '4' is impossible to be represented by using only 2 bits. Accordingly, the symbol value '4' is represented by allowing the '3' that is the maximum value capable of being represented by using first 2 bits to be represented as '11' and the '1' that is the short value to be represented as '01.' As a result, the symbol '4' is represented as '1101.' Similarly, the symbol value '5' is represented as '1110' by using the maximum value '3' with 2 bits and the short value '2.' Since the symbol value '3' is possible to be represented by 2 bits, the symbol value '3' is represented by adding 2 bits and using the short value '0' as '1100' in order to be distinguished from the case of representing 3 and more.

If the aforementioned coding method using a bit-precision is applied to the symbol values of data of 0 through 9, the symbol values can be represented as shown in the following table 1.

TABLE 1

|   | Bit-precision Value 1 Bit | Bit-precision Value 2 Bit | Bit-precision Value 3 Bit | Bit-precision Value 4 Bit | Bit-precision Value 5 Bit |
| --- | --- | --- | --- | --- | --- |
| 0 | 0 | 00 | 000 | 0000 | 00000 |
| 1 | 01 | 01 | 001 | 0001 | 00001 |
| 2 | 001 | 10 | 010 | 0010 | 00010 |
| 3 | 0001 | 1100 | 011 | 0011 | 00011 |
| 4 | 00001 | 1101 | 100 | 0100 | 00100 |
| 5 | 000001 | 1110 | 101 | 0101 | 00101 |
| 6 | 0000001 | 111100 | 110 | 0110 | 00110 |
| 7 | 00000001 | 111101 | 111000 | 0111 | 00111 |
| 8 | 000000001 | 111110 | 111001 | 1000 | 01000 |
| 9 | 0000000001 | 11111100 | 111010 | 1001 | 01001 |

As such, coding data to be inputted by using a bit-precision can make it possible not only to code input data but also to perform the compression as efficiently as the conventional Hoffman coding method by small computation.

FIG. 1 is a block diagram illustrating a coding unit in accordance with an embodiment of the present invention.

Referring to FIG. 1, in accordance with the present invention, the coding device using a bit-precision includes a data input unit 100, a bit-precision selecting unit 110, a coding unit 120 and a bit-stream transmitting unit 130.

The data input unit 100 receives from an outside device data symbols to be coded, and the bit-precision selecting unit 110 selects a bit-precision value adequate for the data symbol values inputted through the data input unit 100.

The coding unit 120 codes each data symbol by using the bit-precision value selected by the bit-precision selecting unit 110 in order to generate a bit-stream and inserts the bit-precision value into a header information field, and the transmitting unit 130 transmits a coded bit-stream to an outside decoding device.

The function and operation of each element included in the coding device in accordance with an embodiment of the present invention will be described with reference to FIG. 2 and related drawings.

Figure 2:
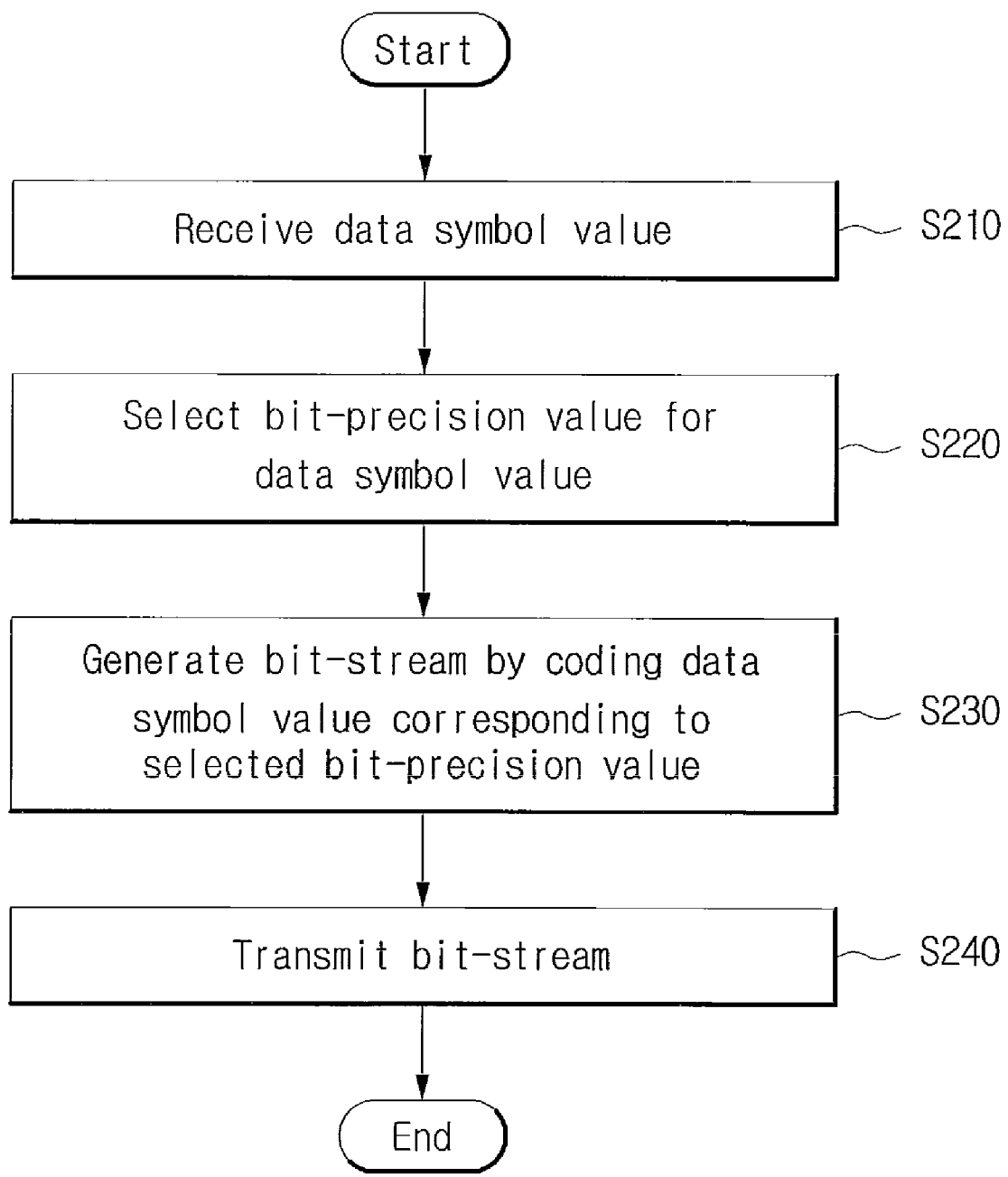
FIG. 2 is a flow chart showing a coding method using a bit-precision in accordance with an embodiment of the present invention.

FIG. 2 is a flow chart showing a coding method using a bit-precision in accordance with an embodiment of the present invention;

Referring to FIG. 2, in a step represented by S210, the data input unit 100 receives a data symbol value to be compressed.

Then, in a step represented by S220, the bit-precision selecting unit 110 selects a bit-precision value adequate for the inputted data symbol values. Here, the method of selecting a bit-precision value can be realized in various ways. This will be described in detail later with reference to FIG. 4 and the related drawings.

In a step represented by S230, the coding unit 120 codes the inputted symbol values by using the bit-precision value selected by the bit-precision selecting unit 110 in order to generate a bit-stream.

At this time, the coding unit 120 can insert the selected bit-precision value into a header information field of the generated bit-stream, which is not shown in FIG. 2.

In a step represented by S240, the bit-stream transmitting unit 130 transmits the coded bit-stream to an outside decoding unit.

Hereinafter, an example of the coding method using the bit-precision in accordance with an embodiment of the present invention, which is described with reference to FIG. 1 and FIG. 2, will be described by referring to FIG. 3.

Figure 3:
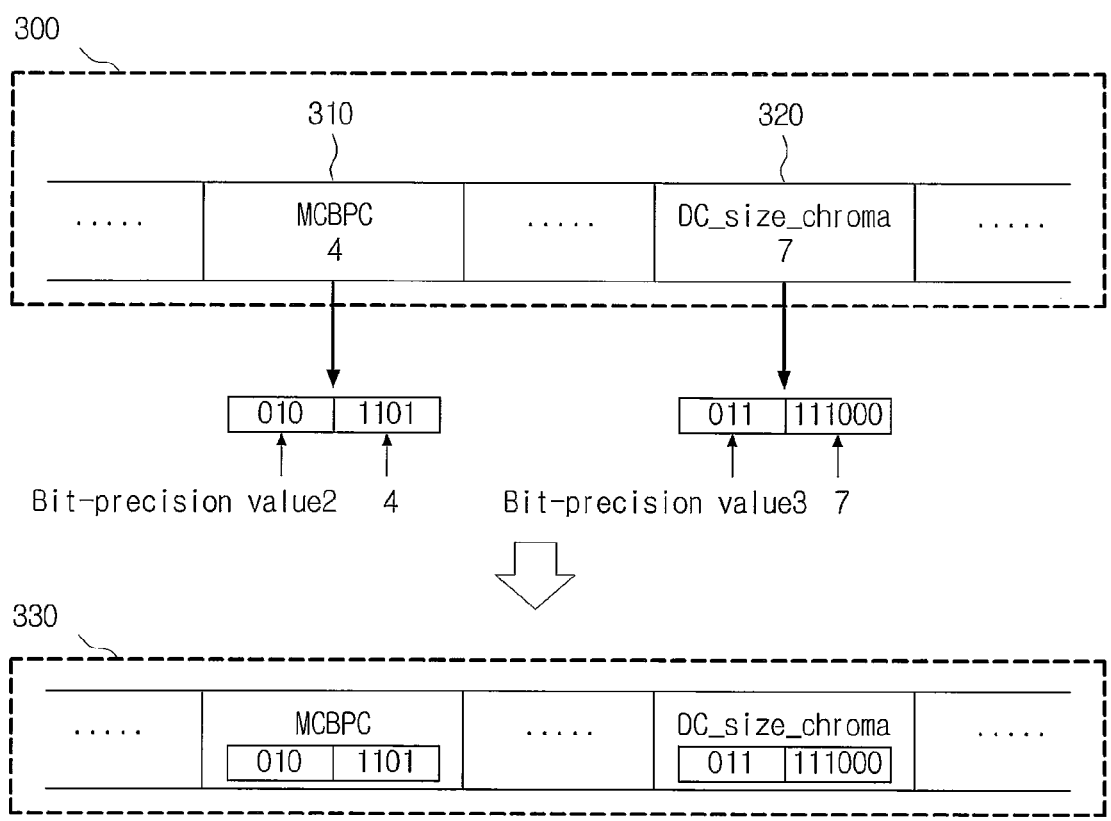
FIG. 3 is an example illustrating a coding process performed by using a bit-precision in accordance with an embodiment of the present invention.

FIG. 3 is an example illustrating a coding process performed by using a bit-precision in accordance with an embodiment of the present invention.

Referring to FIG. 3, the below description assumes the case that the symbol values 300 of the video data inputted into the data input unit 100 are { . . . , 4, . . . , 7, . . . }. At this time, an MCBPC field 310 and a DC_size_chroma field 320 are one of a macro block (MB) hierarchical field and a block (B) hierarchical field of motion picture expert group (MPEG 4) simple profile (SP) intracoding. This will be described later with reference to FIG. 4.

In accordance with an embodiment of the present invention, 3 bit can be assigned to the bit-precision (e.g. the bit-precision value is available between 1 and 7, inclusive).

Here, it is evident to any person of ordinary skill in the art that the number of the bit assigned to the bit-precision can be modified in various ways depending on circumstances in which the coding is performed by using the bit-precision, such as a variety of codecs, profiles and conditions. The below description assumes that 3 bits is assigned to the bit-precision for the convenience of description.

The process of selecting the bit-precision value as 3 bits or less will be described later with reference to FIG. 4 and the related drawings. The below description is related to an example of coding the symbol value by using each selected bit-precision value.

The MCBPC field can have '2,' for example, as the bit-precision value. Accordingly, the symbol value '4' of the MCBPC field coded by using the bit-precision value '2' can be represented as 1101 (i.e. '11' indicating 3 and '01' indicating 1 can be continuously represented).

The DC_size_chroma field can have '3,' for example, as the bit-precision value. Accordingly, the symbol value '7' of the MCBPC field coded by using the bit-precision value '3' can be represented as '111000'.

At this time, the symbol value '7' can be coded as '111'. However, for easy distinguishment from the case of coding the symbol value larger than 7, the symbol value '7' is coded as '111000' by assigning more 3 bits.

The bit-stream 330 completed to be coded can be configured in the form shown in FIG. 3.

At this time, although FIG. 3 illustrates that the bit-precision value selected for each field 310 and 320 is inserted into the generated bit-stream 330, it is evident to any person of ordinary skill in the art that the bit-precision value can be inserted into an upper field or header information of an upper hierarchy, and alternatively, the bit-precision value can be modified in various ways depending on circumstances in which the coding is performed by using the bit-precision, such as a variety of codecs, profiles and conditions.

Hereinafter, the operation of selecting the bit-precision value (i.e. the step represented by S220 in FIG. 2) and the position in which the bit-precision value is inserted into the header information will be described.

Figure 4:
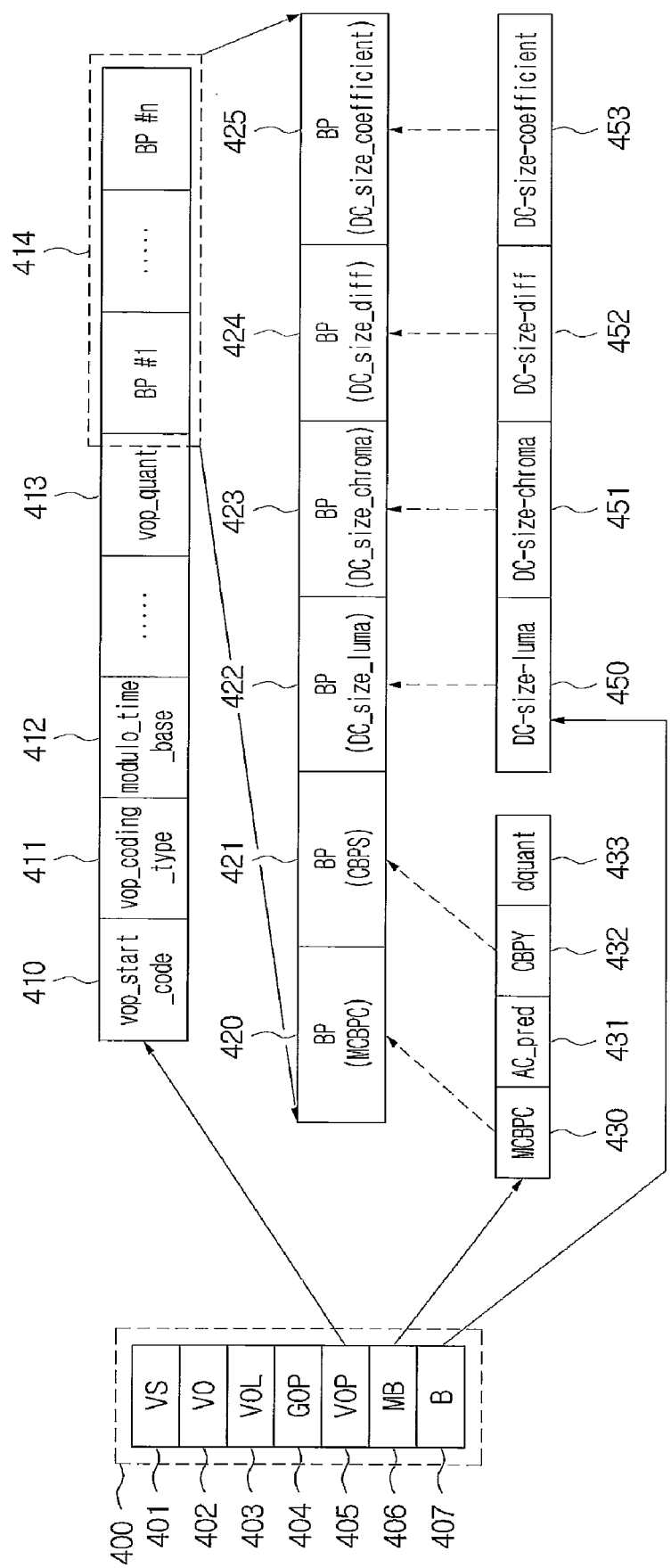
FIG. 4 is a conceptual diagram illustrating that a VOP unit is decoded by using a bit-precision in motion picture expert group 4 (MPEG 4) simple profile (SP) intracoding in accordance with an embodiment of the present invention.

FIG. 4 is a conceptual diagram illustrating that a VOP unit is decoded by using a bit-precision in motion picture expert group 4 (MPEG 4) simple profile (SP) intracoding in accordance with an embodiment of the present invention.

Even though the below description uses the MPEG 4 SP intracoding for the hierarchical structure of data to be coded as an example, it is evident to any person of ordinary skill in the art that the coding process can be performed in different codecs, different profiles and different coding conditions. The below description is related to the MPEG 4 SP intracoding for the convenience of understanding and description.

FIG. 4 illustrates the hierarchical structure of the MPEG-4 bit-stream. In detail, in a bit-stream hierarchy, the intracoding can include a video sequence (VS) 401, a video object (VO) 402, a video object layer (VOL) 403, a group of picture (GOP) 404, a video object plane (VOP) 405, a macro block (MB) 406 and a block (B) 407. The detailed description related to this known technology will be omitted.

Here, the hierarchies of the VS 401 through VOP 405 typically include the header information of video data to be inputted into the data input unit 100, and the symbol value of the video data mainly constitutes the hierarchies of the MB 406 and the B 407.

Accordingly, an embodiment of the present invention performs the coding process using the bit-precision by limiting to the hierarchies of the MB 406 and the B 407. However, it is evident to any person of ordinary skill in the art that this can be modified depending on codecs, profiles and conditions.

For example, in accordance with the present invention, the coding/decoding method is not limited to the application to a hierarchy. The coding/decoding method can be generally or selectively applied to all hierarchies (hereinafter, the hierarchies of the MB 406 and the block 407 are collectively referred to as a "VOP unit."

Also, the present invention can determine the application range/unit of the bit-precision value changeably as necessary. In other words, a plurality of bit-precision values for each field of hierarchies of the MB 406 and the B 407 can be selected in units of VOP. Alternatively, one bit-precision value can be selected for all fields of the B 407 in units of the MB 406. It is evident to any person of ordinary skill in the art that this can be modified depending on codecs, profiles and conditions.

At this time, in the case of coding data in units of VOP by using the bit-precision, it is evident to any person of ordinary skill in the art that the bit-precision value can be inserted into header information of the hierarchy of the VOP 405, for example, and the position in which the bit-precision value is inserted can be changed in various ways.

The hierarchies of the MB 406 and the B 407 include the 8 following items of information.

The hierarchy of the MB 406 includes fields of a macroblock type and coded block pattern for CB and CR: chrominance (MCBPC) 430, an AC prediction (AC_Pred) 431, a coded block pattern for Y: luminance (CBPY) 432 and a difference in the quantizer (DQuant) 433. The hierarchy of the B 407 includes fields of a DC_size_luma 450, a DC_size_chroma 541, a DC_diff 452 and a DCT_coefficients 453.

Briefly, there are 6 blocks in the hierarchy of the MB 406. Of the 6 blocks, the 4 blocks are luminance (Y) blocks, and the 2 blocks are chrominance block (CB and CR). The transformed pixel value of a video is represented as a DC and AC value. The DC values of the 4 luma blocks are represented as the DC_size_luma 450 and the DC_diff 452, and the AC values are represented as DCT_coefficients 453. The DC values of the 2 chroma blocks are represented as the DC_size_chroma 451 and the DC_diff 452, and the AC values are represented as DCT_coefficients 453.

The MCBPC field indicates whether there are the AC values of two chrominance blocks (CB and CR) of an MB. In other words, if the MCBPC value is '00,' it is said that all 63 AC values are 0. If the MCBPC value is '01,' all 63 AC values of the CB block are 0, and at least one of the AC values of the CR block is not 0 and the remain values are 0.

The AC_Pred field is a flag indicating whether there is an AC prediction that is one of intra predictions. If the AC_Pred is '1', the AC_prediction is meant to be 'ON.'

The CBRT field indicates whether there are the AC values of 4 luminance blocks of an MB. In other words, if the CBPY value is '0000,' it is said that all 63 AC values of the 4 luminance blocks are 0. If the CBPY value is '0001,' all 63 AC values of the 3 blocks are 0, and at least one of the AC values of the last block is not 0 and the remaining values are 0.

The DQuant field adjusts a quantiser_scale value. Typically, if the quantiser_scale is determined in units of VOP, when it is necessary to change the quantiser_scale value in the pertinent VOP, the DQuant field is used.

Here, since the field of the AC_Pred 431 of the hierarchy of the MB 406 has less actual benefit to be coded due to having typically 1 bit and there are many cases of having no field of the DQuant 433, an embodiment of the present invention codes fields of the MCBPC 430, the CBPY 432,the DC_size_luma 450, the DC_size_chroma 451, the DC_diff 452 and the DCT_coefficients 453 excluding the foregoing two fields by using the bit-precision. However, it is evident to any person of ordinary skill in the art that the field or/and hierarchy to be coded by using the bit-precision is not limited to the embodiment of the present invention and changeable in various ways.

Here, in the case of the field of the DCT_coefficients 453 which indicates the AC value, the MPEG-4 undergoes the run length coding (RLC) process. Then, if the AC value is converted to values of Run, Level, and Last, the Hoffman entropy coding operation is performed by using these 3 values. In an embodiment of the present invention, 1) a first method to compress the DCT_coefficient values through a BP coding using the Hoffman probability like other field values and 2) a second method to allow the run value and the Level value to be coded by using the bit-precision and compressed and the Last to be transferred as it is. In the first method 1), in the case of being exceptionally processed by applying the symbol value of the DCT_coefficient field to the Hoffman table (e.g. the case that there is no pertinent value in the Hoffman table charted with the Run, Level and Last values, which are often used by the probability), the Run and Level values are represented in BP values identically to the second method 2).

Here, each bit-precision value corresponding to fields of the MCBPC 430, the CBPY 432, the DC_size_luma 450, the DC_size_chroma 451, the DC_diff 452 and the DCT_coefficients 453 is stored in the header information 414 in units of the VOP 405. More particularly, each bit-precision value can be stored in the BP (MCBPC) 420 through the BP (DCT_coefficient) 453.

Hitherto, the concept of coding data by using the bit-precision in case that the hierarchical structure of inputted data is the MPEG4 SP intracoding, for example, has been described.

Hereinafter, the method of selecting the bit-precision value in the VOP unit in the case of assigning 3 bits to the bit-precision value (e.g. the bit-precision value can have 1 through 7 in accordance with an embodiment of the present invention will described.

As a first method increases a bit value from 1 to 7 successively, the first method can code a predetermined part (e.g. predetermined hierarchies, fields, or their combinations) of data inputted from the data input unit 100 and then select the bit value having the best compression efficiency as the bit-precision value by using the coded result.

For example, if the data input unit 100 is assumed to receive the symbol values {5, 3, 8, 2, . . . }, the following table 2 can be provided.

TABLE 2

| BP Symbol | 5 | 3 | 8 | 2 | Total bits |
|---|---|---|---|---|---|
| 1 | 000001 | 0001 | 000000001 | 001 | 22 |
| 2 | 1110 | 1100 | 111110 | 10 | 18 |

TABLE 2-continued

| BP Symbol | 5 | 3 | 8 | 2 | Total bits |
|---|---|---|---|---|---|
| 3 | 101 | 011 | 111001 | 010 | 15 |
| 4 | 0101 | 0011 | 1000 | 0010 | 16 |
| 5 | 00101 | 00011 | 01000 | 00010 | 20 |
| 6 | 000101 | 000011 | 001000 | 000010 | 24 |
| 7 | 0000101 | 0000011 | 0001000 | 0000010 | 28 |

Referring to the table 2, since the compression efficiency is the best one when the bit value is 3, the bit-precision selecting unit 110 can select the bit-precision value as 3.

Here, in accordance with an aspect of the present invention, the bit-precision selecting unit 110 can code a predetermined part of data inputted from the data input unit 100 and then select the bit value corresponding to the case that the compression efficiency is the best one as the bit-precision value by using the coded result.

In accordance with another aspect of the present invention, the coding unit 120 can code a predetermined part of data inputted from the data input unit 100 and then select the bit value corresponding to the case that the compression efficiency is the best one as the bit-precision value by using the result coded by the bit-precision selecting unit 110.

In accordance with another aspect of the present invention, it is evident to any person of ordinary skill in the art that the bit-precision selecting unit 110 or the coding unit 120 can select each bit-precision value per predetermined hierarchy or/and field by repeating the aforementioned steps per predetermined hierarchy or/and field of data inputted from the data input unit 100.

A second method is to select the bit-precision value by using the Hoffman table.

More particularly, the second method, which is to perform the decoding by using the probability of the Hoffman table provided from the standardized codec, can use the probability of the Hoffman table corresponding to a pertinent field (e.g. MCBPC or CBPY) of the codec to be coded.

The basic concept of the entropy coding is to assign the code having the least bits to the most frequent symbol value by using the probability. Accordingly, as increasing the bit-precision value from 1 to 7 successively by using the Hoffman table provided by the MPEG 4, the bit-precision selecting unit 110 can code a predetermined part of data inputted from the data input unit 100 and then select the bit value corresponding to the case that the compression efficiency is the best one as the bit-precision value.

For example, if it is assumed that the bit-precision value is 3 and the coding is performed by using the inputted data and the probability provided by the Hoffman table, the following table 3 is provided. Here, the probability provided by the Hoffman table refers to the table expecting the frequency and the probability in which the symbols are generated according to the length of the code value used in the table.

TABLE 3

| Hoffman Code | CBPY (1234) | Probability | BP (3) |
|---|---|---|---|
| 0011 | 0000 | 1 | 001 |
| 0010 1 | 0001 | 10 | 111011 |
| 0010 0 | 0010 | 11 | 111100 |
| 1001 | 0011 | 2 | 010 |
| 0001 1 | 0100 | 12 | 111101 |
| 0111 | 0101 | 3 | 011 |
| 0000 10 | 0110 | 14 | 111111000 |
| 1011 | 0111 | 4 | 100 |

TABLE 3-continued

| Hoffman Code | CBPY (1234) | Probability | BP (3) |
|---|---|---|---|
| 0001 0 | 1000 | 13 | 111110 |
| 0000 11 | 1001 | 15 | 111111001 |
| 0101 | 1010 | 5 | 101 |
| 1010 | 1011 | 6 | 110 |
| 0100 | 1100 | 7 | 111000 |
| 1000 | 1101 | 8 | 111001 |
| 0110 | 1110 | 9 | 111010 |
| 11 | 1111 | 0 | 000 |

Referring to the table 3, since the symbol value '1111' is most frequent in the CBPY 432, if the bit-precision value is 3, '000' having small bits is assigned to the symbol value '1111.' Since the symbol value '1001' is relatively less frequent, '111111001' having relatively many bits is assigned to the symbol value '1001.'

For example, if some of the data symbol values of the CBPY 432 inputted into the data input unit 100 is {'1010', '0111', . . . }, in case that the bit-precision value is 3, the data symbol values {'0010', '0111', . . . } are coded by using the Hoffman table, the data symbol values {'0010', '0111', . . . } becomes {'1010, '0111', . . . }.

With the aforementioned method, the bit-precision selecting unit 110 can select the bit value having the best compression efficiency as the bit-precision value by using the result coded by use of 1 through 7.

Hitherto, the method of selecting the bit-precision by the bit-precision selecting unit 110 has been described.

The below description is related to the units used when the bit-precision selecting unit 110 selects the bit-precision and when the coding unit 120 performs the coding by using the bit-precision value.

As described above, the hierarchical structure of the inputted data includes the hierarchies of the video sequence (VS) 401, the video object (VO) 402, the video object layer (VOL) 403, the group of picture (GOP) 404, the video object plane (VOP) 405, the macro block (MB) 406 and the block (B) 407 (refer to FIG. 4). For the convenience of understanding and description, the below description uses the MPEG4 SP intracoding as an example.

Coding the MB block 406 and the B 407 by using the bit-precision in units of VOP of the MPEG4 SP intracoding has been described with reference to FIG. 4.

The bit-precision values selected for each field of the VOP units can be inserted into a hierarchy 414 in back of the header information of the VOP 405.

Here, it is evident to any person of ordinary skill in the art that the bit-precision value can be positioned in front or back of the header information or therebetween and this can be modified in various ways depending on the coding environments such as codecs, profiles and conditions.

FIG. 5 and FIG. 6 show various examples of units selecting a bit-precision value and coding data by using a bit-precision value.

As described above, since the hierarchies of the VS 401 and the VOP 405 typically includes the header information in the MPEG 4 SP intracoding, the symbol values of video data inputted into the data input unit 100 mainly consist of the MB 406 and the B 407. Accordingly, the large actual benefit to perform the coding in units of VOP is given.

Accordingly, the description is related to the case that the bit-precision value is selected by using the bit-precision in units of VOP. However, it is evident to any person of ordinary skill in the art that the units by which the bit-precision value is selected and the coding is performed can be modified in various ways depending on the coding environments such as codecs, profiles and other conditions.

The below description uses the MPEG 4 SP intracoding as an example for the convenience of description.

Referring to FIG. 5 and FIG. 6, FIG. 5 (a) is an example of the case that one bit-precision value is selected for all fields of all VOP units of inputted data and the coding is performed by commonly applying the bit-precision value.

For example, FIG. 5 (a) can show the case that the coding is performed by applying a bit-precision value to all fields of the all VOP units. Here, the bit-precision value is selected by the bit-precision selecting unit 110 by using the symbol value of the first field of the first VOP units of inputted data (e.g. the field of the MCBPC 430 of the hierarchy of the MB 406).

FIG. 5 (b) is an example of the case that the bit-precision selecting unit 110 selects the bit-precision value per VOP unit of the inputted data.

For example, all data of VOP units can be coded by using each bit-precision value per VOP unit (refer to FIG. 5 (b)). The hierarchies of the MB and the B can be coded in units of VOP (refer to FIG. 5 (c)). A certain filed of the hierarchy of the MB and/or the B can be coded (FIG. 5 (d)).

FIG. 5 (e) is an example of the case that the bit-precision selecting unit 110 selects the bit-precision value per field of the inputted data.

For example, all data of VOP units can be coded by using the bit-precision value selected per field (refer to FIG. 5 (e)). The hierarchies of the MB and the B can be coded in units of VOP (refer to FIG. 6 (f)). A certain filed of the hierarchy of the MB and/or the B can be coded (FIG. 6 (g)).

FIG. 6 (h) is an example of the case that the bit-precision selecting unit 110 selects each bit-precision value per VOP unit and per field.

For example, all data of VOP units can be performed by using each bit-precision value selected per VOP unit and per field (refer to FIG. 6 (h)). The hierarchies of the MB and the B can be coded in units of VOP (refer to FIG. 6 (i)). A certain filed of the hierarchy of the MB and/or the B can be coded (FIG. 6 (j)).

In accordance with another embodiment of the present invention, the unit by which the bit-precision selecting unit selects the bit-precision can be different from the unit by which the coding unit 120 performs the coding by using the bit-precision value. At this time, it is evident to any person of ordinary skill in the art that the bit-precision value can further include information related to the units to select the bit-precision value and to perform the coding.

For example, while the bit-precision unit 110 can commonly select one bit-precision value for all fields of all VOP units of the inputted data, the coding unit 120 can selectively code a predetermined field by using the selected bit-precision value (refer to 501).

For example, while the bit-precision selecting unit 110 can select the bit-precision value per VOP unit of the inputted data, the coding unit 120 can selectively code a predetermined field per VOP unit (refer to 502 and 503).

In accordance with another embodiment of the present invention, the results of the case of performing the coding by using the Huffman table of the conventional MPEG 4 and the case of performing the coding by using the bit-precision value in accordance with the present invention can be compared with each other. According to the compared result, when the case of using the bit-precision value has the better compression rate than the case of using the Huffman table, the coding can be performed by using the bit-precision value.

At this time, it is evident to any person of ordinary skill in the art that the units by which the bit-precision selecting unit 110 selects the bit-precision value and by which the coding unit 120 performs the coding can be changed in various ways.

Hitherto, the cases that the units by which the bit-precision selecting unit 110 selects the bit-precision and by which the coding unit 120 performs by using the bit-precision value are the same as and different from each other have been described. The below description is related to various examples of the structure of the bit-stream generated by performing the coding by use of the bit-precision value.

FIG. 7 and FIG. 8 show various examples of a bit-stream coded by using a bit-precision in motion picture expert group 4 (MPEG 4) simple profile (SP) intracoding in accordance with an embodiment of the present invention.

The structure of the bit-stream is determined depending on the unit by which the bit-precision on selecting unit 110 selects the bit-precision, the unit by which the coding unit 120 performs the coding by using the bit-precision and the position at which the bit-precision value is inserted into the coded stream. Here, since the units by which the bit-precision selecting unit 110 selects the bit-precision and by which the coding unit 120 performs the coding by using the bit-precision have been already described with reference to FIG. 5 and FIG. 6, the position at which the bit-precision value is inserted into the coded stream will be mainly described hereinafter.

Referring to FIG. 7, the bit-precision value is positioned in back of the header information in the MPEG 4 SP intracoding in accordance with an embodiment of the present invention.

Here, it is evident to any person of ordinary skill in the art that the bit-precision value can be positioned in front or back of the header information or therebetween and this can be modified in various ways depending on the coding environments such as codecs, profiles and conditions.

Referring to FIG. 7, FIG. 7 (a) is an example of the bit-stream coded in the case of selecting the bit-precision in units of the VS 401. The bit-precision values BP#1 through BP#n are positioned in back of the header information of the VS 401. Accordingly, it is evident to any person of ordinary skill in the art that At this time, all hierarchies of the VO 402 through the B 407 or an individually certain field or/and hierarchy, which can be coded by using the bit-precision, have been already described with reference to MG. 5 and FIG. 6. It is evident to any person of ordinary skill in the art that the number of the bit-precision values BP#1 through BP#n can be changed in various ways according to the applied embodiments of the present invention.

Similarly, FIG. 7 (b), FIG. (c) and FIG. 8 (d) through FIG. 8 (f) are examples of the bit-stream generated by allowing each bit-precision value to be inserted into the back of the header information.

Here, FIG. 8 (e) illustrates the case of selecting the bit-precision in units of VOP. This has been already described in detail with reference to FIG. 4.

FIG. 8 (g) is an example of the bit-stream generated by allowing the bit-precision value of each field of the hierarchy of the B 407 to be inserted into the front of the hierarchy of the B 407.

At this time, as described above with reference to FIG. 5 and FIG. 6, all fields of the hierarchy of the block 407 such as the DC_size_luma 450, the DC_size_chroma 451, the DC_diff 452 and the DCT_coefficient 453 can be coded or a certain field can be coded.

The above description is related to the method of selecting the bit-precision value, the unit by which the coding is performed by using the bit-precision value and the structure of the bit-stream is generated by being coded. The below description is related to a decoding device and a method thereof using the bit-precision value.

Figure 9:
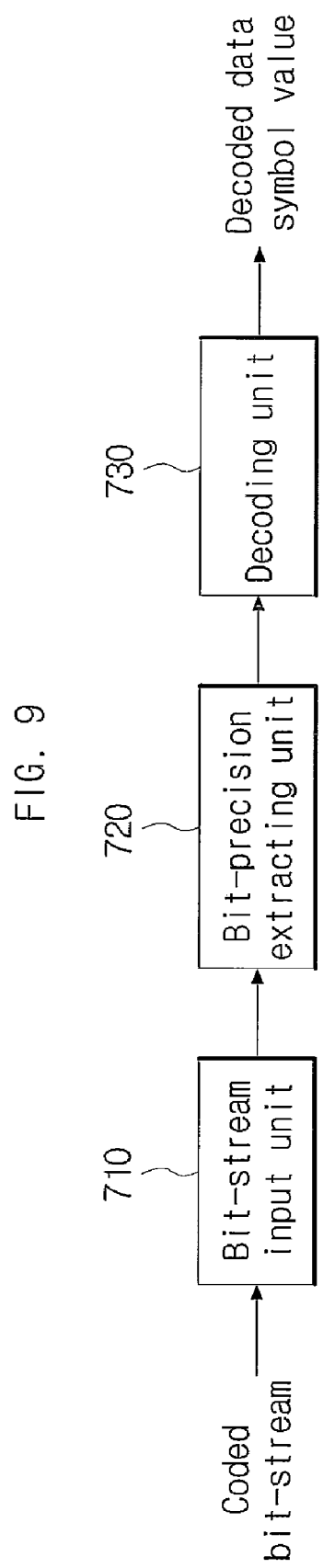
FIG. 9 is a block diagram illustrating a decoder using a bit-precision in accordance with an embodiment of the present invention.

FIG. 9 is a block diagram illustrating a decoder using a bit-precision in accordance with an embodiment of the present invention.

Referring to FIG. 9, in accordance with an embodiment of the present invention, the decoding device using the bit-precision includes a bit-stream input unit 710, a bit-precision extracting unit 720 and a decoding unit 730.

The bit-stream input unit 710 receives a bit-stream coded by using the bit-precision from a coding device, and the bit-precision extracting unit 720 extracts a bit-precision value from the inputted bit-stream.

The decoding unit 730 restores a data symbol by decoding the bit-stream by use of the extracted bit-precision.

The functions and operations of each element of the decoding device in accordance with an embodiment of the present invention will be described below with reference to FIG. 10.

Figure 10:
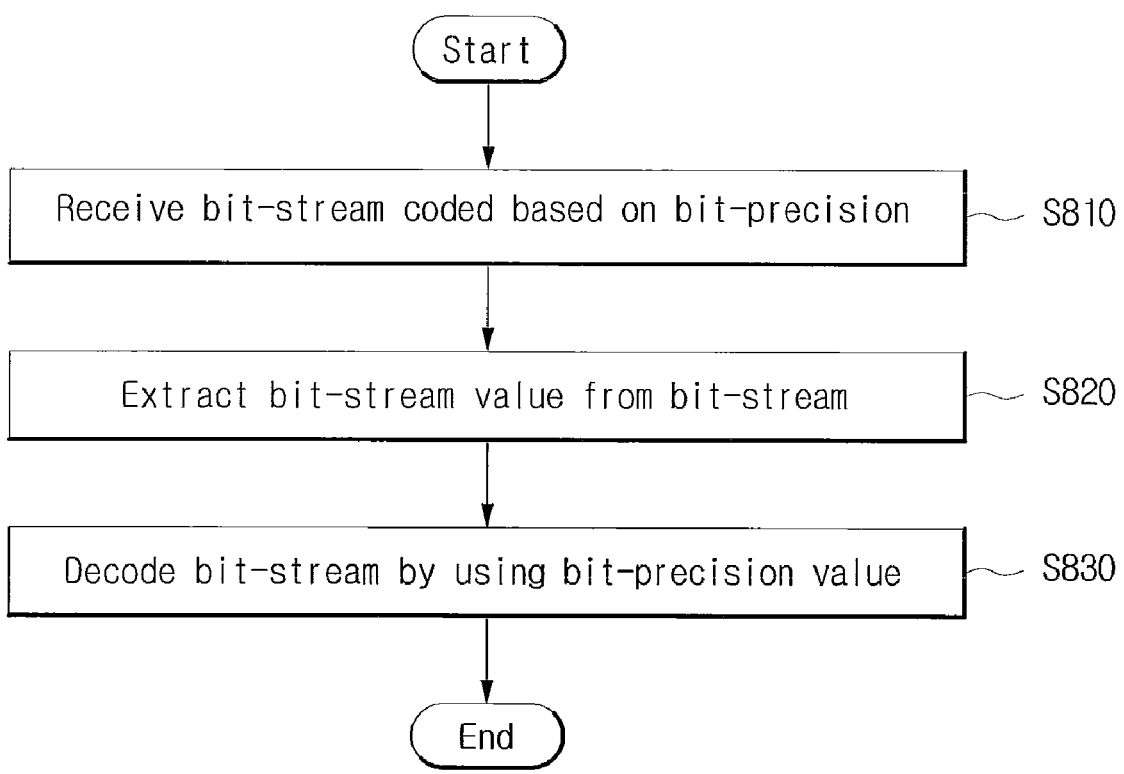
FIG. 10 a flow chart showing a decoding method using a bit-precision in accordance with an embodiment of the present invention.

FIG. 10 a flow chart showing a decoding method using a bit-precision in accordance with an embodiment of the present invention.

The decoding method using the bit-precision is performed in the reverse order of the coding method using the bit-stream described with reference to FIG. 2.

In a step represented by S810, the bit-stream input unit 710 receives a bit-stream coded by using the bit-precision from a coding device.

Then, in a step represented by S820, the bit-precision extracting unit 720 extracts a bit-precision value from the inputted bit-stream.

Here, since the bit-precision values are inserted into various positions of the bit-streams generated by being coded as described with reference to FIG. 6, the bit-precision extracting unit 720 extracts a bit-precision value from a pertinent position according to the structure of the coded bit-stream.

Then, in a step represented by S 830, the data symbol value is restored by decoding the bit-stream coded by use of the extracted bit-precision value.

Figure 11:
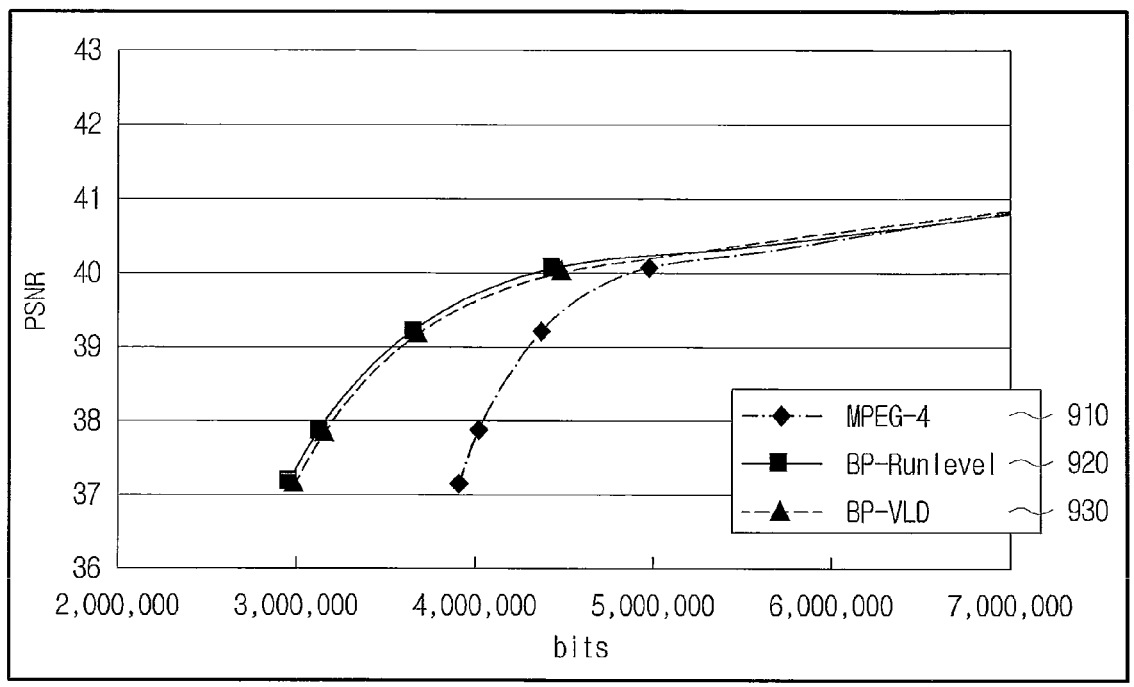
FIG. 11 illustrates a test result of a coding/decoding process performed by using a bit-precision in accordance with an embodiment of the present invention.

FIG. 11 illustrates a test result of a coding/decoding process performed by using a bit-precision in accordance with an embodiment of the present invention.

The name of the video data used for the test is woman and the video data has the size of 1920×1080.

Referring to FIG. 11, the graph shown in FIG. 11, which is a rate-distortion (RD), indicates the image quality as compared with the compression rate. Typically, the difference of the image quality 1 dB indicates the difference capable of being recognized by an aided eye. The Y-axis, which refers to a peek signal to noise rate (PNSR) value, is the ratio of signal to noise in the maximum electrical power and the value used as the scale of image quality in the international standard. The pertinent description will be described. The X-axis refers to the original compression bits of video data.

Here, an MPEG-4 910 basically uses the Hoffman probability. As described above, in the case of the DCT_coefficients 453, if an AC value is converted to Run, Level and Last values by undergoing the run length coding (RLC) operation, the BP-runlevel 920 codes the Run and Level values separately by using the bit-precision to perform the compression and transfers the Last value itself. The BP-VLD 930 allows the DCT_coefficients 453 to undergo the RLC operation and the code values of the variable length decoding (VLD) table corresponding to the Run, Level and Last value to be coded by using the bit-precision to be compressed.

In accordance with an embodiment of the present invention, the coding/decoding method using the bit-precision can have the additional compression efficiency taking advantage of existing codecs, profiles and other algorithms without additional pre-modification. Here, the additional compression efficiency is tested by attempting the decoding of the code values corresponding to the Run, Level and Last values of the DCT_coefficients 453 by use of the variable length decoding table.

Referring to the RD graph shown in an upper part of FIG. 11, in accordance with an embodiment of the present invention, it can be recognized that the coding/decoding method using the bit-precision has the same image quality and better compression rate as compared with the conventional MPEG-4 method.

In particular, if the compression rate is reviewed in detail with reference to the table shown in a lower part of FIG. 11, it is recognized that the compression efficiency can be improved by 30% at the maximum based on the same image quality as compared with the conventional MPEG-4 method.

In accordance with an embodiment of the present invention, the decoding method has the same image quality and less decoding complexity as compared with the conventional MPEG-4 method. This will be described with reference to the following table 4.

TABLE 4

| QP | Huffman Decoding time | BP-RunLevel Decoding time | % | BP-VLD Decoding time | % |
|---|---|---|---|---|---|
| 4  | 1.4685 | 1.8497 | 79.39 | 1.8578 | 79.04 |
| 10 | 1.5440 | 1.9087 | 80.89 | 1.9354 | 79.78 |
| 16 | 1.5540 | 1.9277 | 80.61 | 1.9493 | 79.72 |
| 26 | 1.5603 | 1.9345 | 80.66 | 1.9552 | 79.80 |
| 31 | 1.5661 | 1.9462 | 80.47 | 1.9405 | 80.71 |

The values of the table 4 have the units of FpS (frame per second). The values of the table 4 are average values evaluated after the decoding step is performed 3 times per QP. Larger values indicate less complexity.

Referring to the table 4, it can be recognized that the decoding method (BP-RunLevel) using the bit-precision has the about 20% decreased decoding time as compared with the conventional MPEG-4 method using the Hoffman probability.

In accordance with an embodiment of the present invention, it can be also recognized that the decoding method (BP-VLD) using the bit-precision by referring to the above-described VLD table has the reduced decoding method as compared with the conventional MPEG-4 method.

Here, the detailed description related to the VLD, which is the known technology, will be omitted.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalents.

[Industrial Applicability]

The coding method using a bit-precision in accordance with the present invention can entropy-code video data by selectively determining the number of bits to represent a letter and a numeral instead of representing information by using a Hoffman table determined in the conventional Hoffman entropy coding/decoding method.

The present invention can also perform the decoding method with a little complexity which has not only the identical compression rate to the conventional entropy coding method but also no necessity of additional computation when video data is decoded.

In addition, the present invention can improve environmentally additional compression efficiency without the change of the conventional codec and with the same image quality.

The invention claimed is:

1. A coding device configured to encode discrete cosine transform (DCT) coefficients corresponding to at least one pixel, the DCT coefficients having been run-length encoded into a Run value, a Level value and a Last value, the coding device comprising:
   a bit-precision selecting unit; and
   a coding unit operatively connected to the bit-precision selecting unit,
   wherein the bit-precision selecting unit is configured to
      encode the Run value and the Level value according to each of a plurality of predetermined bit-precision values, and
      select a bit-precision value, among the plurality of predetermined bit-precision values, corresponding to an encoded Run value and an encoded Level value having a lowest volume,
   wherein the coding unit is configured to generate a bit-stream by
      encoding the Run value and the Level value according to the selected bit- precision value, and
      encoding the Last value independent of the bit-precision value, and
   wherein the selected bit-precision value is inserted into the bit-stream.

2. The coding device of claim 1, wherein the bit-precision selecting unit is configured to select a bit value of the Run value and the Level value corresponding to a highest compression efficiency as the bit-precision value.

3. The coding device of claim 2, wherein the bit-precision selecting unit is configured to encode the Run value and the Level value according to the selected bit-precision value with a probability of a Huffman table.

4. The coding device of claim 1, wherein the coding unit is configured to encode the Last value with a probability of a Huffman table.

5. The coding device of claim 1, wherein the coding unit is configured to encode the Run value and the Level value according to the selected bit-precision value with a probability of a Huffman table.

6. A decoding device configured to decode discrete cosine transform (DCT) coefficients corresponding to at least one pixel, the DCT coefficients having been run-length encoded into a Run value, a Level value and a Last value, the decoding device comprising:
   a bit-precision extracting unit configured to extract a bit-precision value from an encoded bit-stream; and
   a decoding unit configured to decode the encoded bit-stream according to the extracted bit-precision value,
   wherein the bit-precision extracting unit is configured to extract the bit-precision value according to a field unit or a hierarchy unit of the encoded bit-stream or a combination thereof, and
   wherein the encoded bit-stream is encoded by a coding method that includes:
      encoding the Run value and the Level value according to each of a plurality of predetermined bit-precision values;

selecting the bit-precision value, among the plurality of predetermined bit-precision values, corresponding to an encoded Run value and an encoded Level value having a lowest volume;

encoding the Run value and the Level value according to the selected bit-precision value; and encoding the Last value independent of the bit-precision value.

7. The decoding device of claim 6, wherein the decoding unit further uses a probability of a Huffman table to decode the encoded bit-stream.

8. A method of encoding discrete cosine transform (DCT) coefficients corresponding to at least one pixel, the DCT coefficients having been run-length encoded into a Run value, a Level value and a Last value, the method comprising:

encoding the Run value and the Level value according to each of a plurality of predetermined bit-precision values;

selecting a bit-precision value, among the plurality of predetermined bit-precision values, corresponding to an encoded Run value and an encoded Level value having a lowest volume; and generating a bit stream by encoding the Run value and the Level value according to the selected bit-precision value; and encoding the Last value independent of the bit-precision value, wherein the selected bit-precision value is inserted into the bit-stream.

9. The method of claim, 8, wherein the step of encoding the Run value and the Level value according to each of a plurality of predetermined bit-precision values comprises:

encoding the Run value and the Level value with a probability of a Huffman table.

10. The method of claim 8, wherein the step of encoding the Last value comprises:

encoding the Last value with a probability of a Huffman table.

11. A method of decoding discrete cosine transform (DCT) coefficients corresponding to at least one pixel, the DCT coefficients having been run-length encoded into a Run value, a Level value and a Last value, the method comprising:

(a) extracting a bit-precision value from an encoded bit-stream; and (b) decoding the encoded bit-stream according to the extracted bit-precision value, wherein the bit-precision value is extracted according to a field unit of the encoded bit-stream, a hierarchy unit of the encoded bit-stream or a combination thereof, and wherein the encoded bit-stream is encoded by a coding method that includes:

encoding the Run value and the Level value according to each of a plurality of predetermined bit-precision values;

selecting the bit-precision value, among the plurality of predetermined bit-precision values, corresponding to an encoded Run value and an encoded Level value having a lowest volume;

encoding the Run value and the Level value according to the selected bit-precision value; and encoding the Last value independent of the bit-precision value.

12. The decoding method of claim 11, wherein the step of (b) further uses a probability of a Huffman table to decode the encoded bit-stream.

13. A non-transitory recorded medium tangibly embodying a program of instructions executable by a coding device to perform a method of encoding discrete cosine transform (DCT) coefficients corresponding to at least one pixel, the DCT coefficients having been run-length encoded into a Run value, a Level value and a Last value, the recorded medium being readable by the coding device, the method comprising:

encoding the Run value and the Level value according to each of a plurality of predetermined bit-precision values;

selecting the bit-precision value, among the plurality of predetermined bit-precision values, corresponding to an encoded Run value and an encoded Level value having a lowest volume; and generating a bit stream by encoding the Run value and the Level value according to the selected bit-precision value; and encoding the Last value independent of the bit-precision value, wherein the selected bit-precision value is inserted into the bit-stream.

14. A non-transitory recorded medium tangibly embodying a program of instructions executable by a decoding device to perform a method of decoding discrete cosine transform (DCT) coefficients corresponding to at least one pixel, the DCT coefficients having been run-length encoded into a Run value, a Level value and a Last value, the recorded medium being readable by the decoding device, the method comprising:

(a) extracting a bit-precision value from an encoded bit-stream; and (b) decoding the encoded bit-stream according to the extracted bit-precision value, wherein the bit-precision value is extracted according to a field unit of the encoded bit-stream, a hierarchy unit of the encoded bit-stream or a combination thereof, and wherein the encoded bit-stream is encoded by a coding method that includes:

encoding the Run value and the Level value according to each of a plurality of predetermined bit-precision values;

selecting the bit-precision value, among the plurality of predetermined bit-precision values, corresponding to an encoded Run value and an encoded Level value having a lowest volume;

encoding the Run value and the Level value according to the selected bit-precision value; and encoding the Last value independent of the bit-precision value.

* * * * *